United States Patent [19]
Brooks et al.

[11] Patent Number: 5,338,209
[45] Date of Patent: Aug. 16, 1994

[54] ELECTRICAL INTERFACE WITH MICROWIPE ACTION

[75] Inventors: Charles P. Brooks, Winston-Salem; Donald J. Leahy; Mark M. Fowler, both of Kernersville; Jackie K. Everidge, Jr., Winston-Salem, all of N.C.

[73] Assignee: The Whitaker Corporation, Wilmington, Del.

[21] Appl. No.: 61,989

[22] Filed: May 13, 1993

[51] Int. Cl.$^5$ .............................. H01R 9/09
[52] U.S. Cl. ....................... 439/66; 439/91
[58] Field of Search ............ 439/66, 67, 69, 77, 439/91, 387, 591

[56] References Cited

U.S. PATENT DOCUMENTS

| | | | |
|---|---|---|---|
| 4,109,378 | 8/1978 | Davies | 439/69 X |
| 4,451,714 | 5/1984 | Eventoff | 200/5 A |
| 5,061,192 | 10/1991 | Chapin et al. | 439/66 |
| 5,141,444 | 8/1992 | Redmond et al. | 439/91 X |
| 5,199,882 | 4/1993 | Bates et al. | 439/66 X |

Primary Examiner—Khiem Nguyen
Attorney, Agent, or Firm—William B. Noll

[57] ABSTRACT

A circuit interface for an electrical connector having a compressible elastomeric core. The circuit traces on the elastomeric core have a roughened copper foil inner layer, an intermediate metal layer and a gold outer layer in which the intermediate layer and outer layer have asperites which correspond with and complement the roughened surface of the copper inner layer. The asperites abrade and bite through oxidized surfaces of electrical members which are contacted by the circuit traces on the elastomeric core and assure good electrical conductivity for the circuit interface.

12 Claims, 4 Drawing Sheets

ELECTRICAL INTERFACE WITH MICROWIPE ACTION

FIELD OF THE INVENTION

The present invention relates to an electrical interface and more particularly to an interface between circuit traces on a flexible electrical surface susceptible to oxidation wherein a microwiping action provides a reliable electrical connector.

BACKGROUND OF THE INVENTION

Electrical interfaces are usually formed with a pair, or multiple pairs, of opposing spaced-apart surfaces which are electrically connected when the circuit is closed. The surfaces may be brought into direct contact with one another or there may be an intermediate connector means between the opposing surfaces.

In a variety of product applications, the prior art has used compressible electrical connectors which are well known in the electronic industry. These compressible electrical connectors include a plurality of closely-pitched conductive circuit elements or traces photographically etched or otherwise formed on a flexible film which is bonded to an elastomeric core or other suitable carrier. Under the trademark "AMPLIFLEX", AMP Incorporated of Harrisburg, Pa., supplies a wide variety of such compressible electrical connectors to the electronic and aerospace industries.

The effectiveness of the electrical interface between the conductive elements on compressible connector and the surface on the circuit element which is contacted is dependent upon several factors. One of these factors is the materials which are in direct contact such as the metals or metallic platings of silver, copper, nickel, tin, gold, etc. Another factor is the compressibility and resiliency of the elastomeric core. A third factor is the nature of the physical contact which is made between conductive elements and the respective surfaces.

With respect to the latter factor, when the physical contact is between relatively smooth and uniform metals, the electrical connection is frequently unsatisfactory. This electrical contact is frequently degraded by the presence of dirt or dust at the contact interface. Another commonly occurring problem is oxidation of one or both of the metal contact surfaces which seriously degrades the efficiency and reliability of the electrical contact.

It is important therefore, to have a reliable electrical connection between the interfacing surfaces to assure a reproducible and complete electrical circuit even in the presence of dirt and oxidized metallic surfaces.

SUMMARY OF THE INVENTION

The present invention provides a reliable electrical connection between contacting-metallic surfaces by a microwiping action.

In accordance with the teachings of the present invention, there is disclosed herein an electrical circuit interface. A flexible electrical connector has a compressible elastomeric core provided with a plurality of closely-pitched circuit traces carried thereon. The circuit traces comprise a Copper foil having a plating thereon and further having a gold plating on the plating. The circuit traces engage at least one circuit element on an electrical member, the circuit element on the electrical member comprising a tin or tin alloy susceptible to oxidation. The oxidation on the tin or tin alloy on the circuit element interferes with good electrical conductivity with the gold-plated copper foil. A toughened surface is provided on the copper foil prior to its plating and gold plating. In this manner, a microwiping action is provided which bites through the oxidation and assures good electrical conductivity for the circuit interface.

The electrical circuit interface may be used with the compressible core connector and a circuit element on the electrical member having a gold plating.

These and other objects of the present invention will become apparent from a reading of the following specification, taken in conjunction with the enclosed drawings.

DESCRIPTION OF THE PREFERRED EMBODIMENTS

Figure 1:
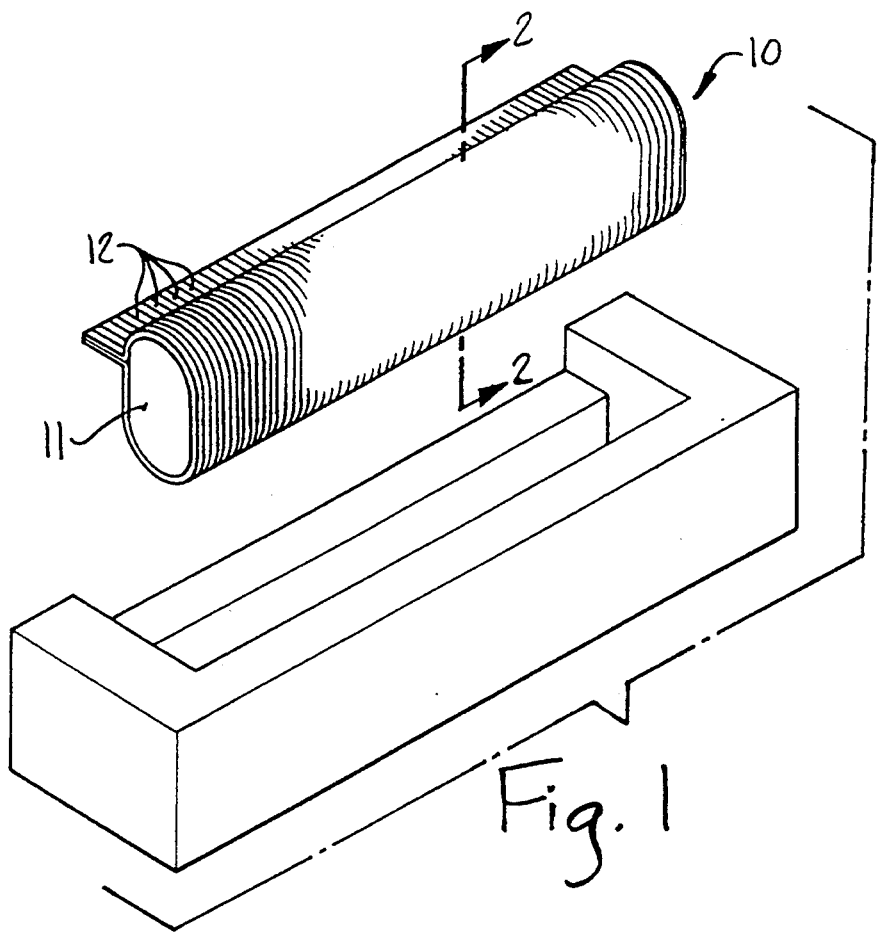
FIG. 1 is a perspective view of a flexible connector in a typical application and produced by the teachings of this invention.
Figure 2:
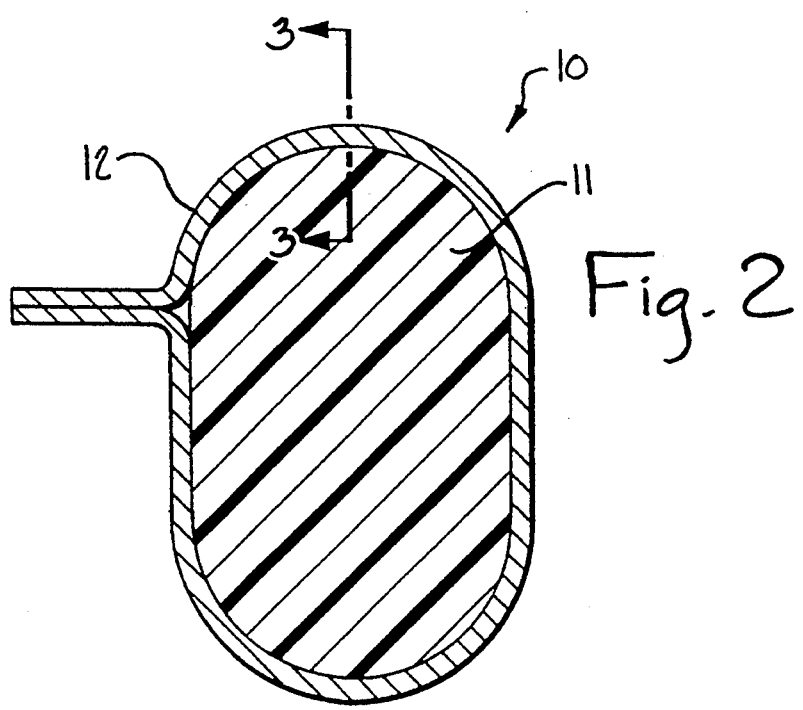
FIG. 2 is a cross-sectional view taken along the lines 2—2 of FIG. 1 showing the circuit traces about the elastomeric core.
Figure 3:
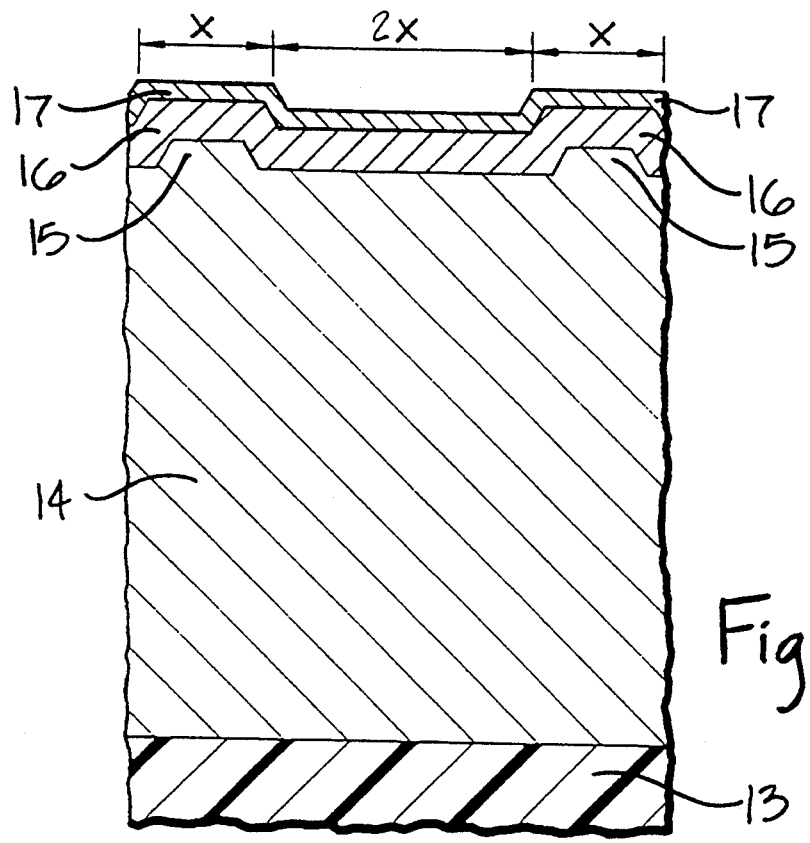
FIG. 3 is a cross-sectional view taken across the lines 3—3 of FIG. 2.

The flexible connector 10 with the elastomeric core 11 which has been widely used in the electronic industry has a plurality of circuit traces 12 carried on the core 11. Referring now to FIGS. 1-6, the circuit trace 12 is formed from an inner layer 13 of flexible plastic in the form of a film, which is bonded to the core 11. A base layer of copper 14 (a copper foil) is disposed on the plastic inner layer 13. The base copper foil 14 is toughened to form a roughened surface. A plurality of spaced-apart asperites 15 are formed on the surface of the copper layer which is opposite from the surface adjacent to the plastic inner layer 13. An intermediate conducting metal layer 16 is disposed on the roughened surface of the copper layer 14 such that the conducting metal layer 16 also has a roughened surface with spaced-apart asperites 15 formed thereon, which are corresponding to and complementary to the asperites 15 on the roughened copper layer 14. The intermediate conducting metal layer preferably is formed from nickel but other metals such as silver may be used. An outer layer 17 of gold is disposed on the surface of the intermediate conducting metal (nickel) layer 16 such that the outer layer 17 also has a roughened surface with asperites 15 which are corresponding to and complementary to the asperites on the underlying nickel 16 and copper 14 layers. The intermediate conducting metal layer 16 is to enable the circuit trace 12 to have an outer layer 17 of gold since gold can be disposed on nickel and silver but cannot be disposed or plated directly on copper. In a preferred embodiment, the plastic layer has a thickness of approximately 1.0 mil. the copper layer 14 has a thickness of approximately 0.7 mils, the conducting metal (nickel) layer 16 has a thickness of approximately 50 microinches and the outer (gold) layer 17 has a thickness of approximately 20 microinches. The ratio of the thickness of the layers is inner plastic 50, copper 35, nickel 2.5 and gold 1.

Figure 4:
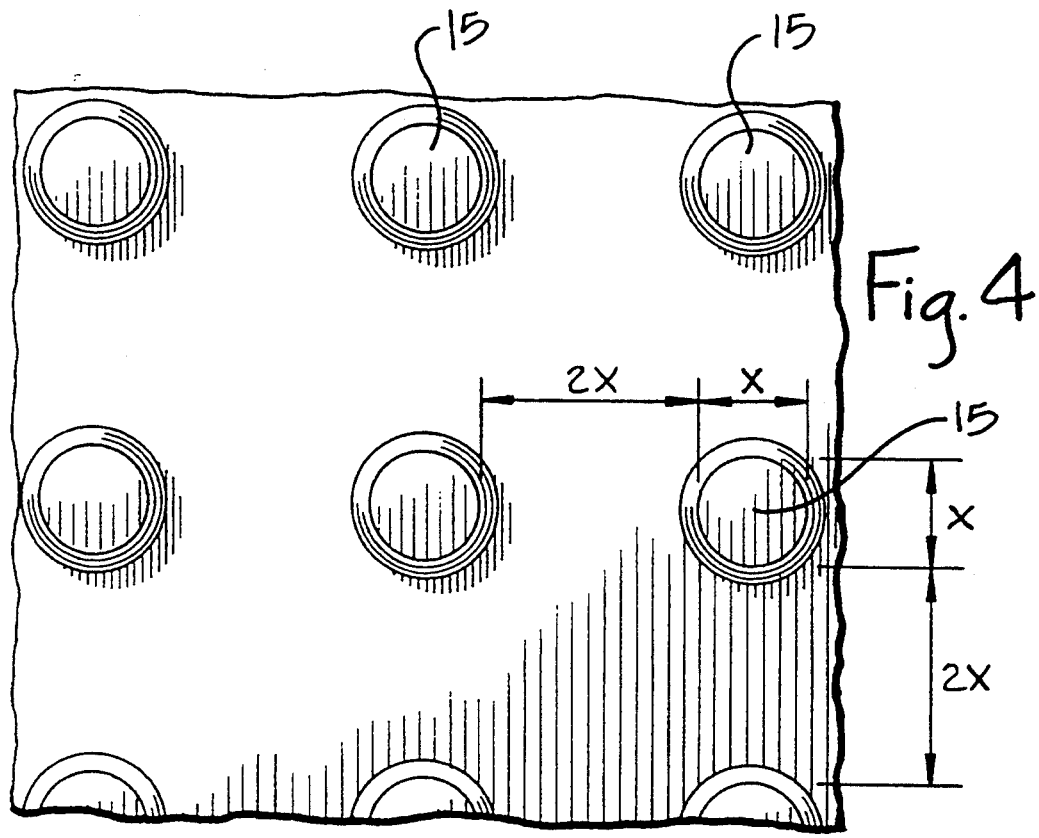
FIG. 4 is a top plan view of the circuit trace showing the pattern of the toughened surface in a preferred embodiment.
Figure 5:
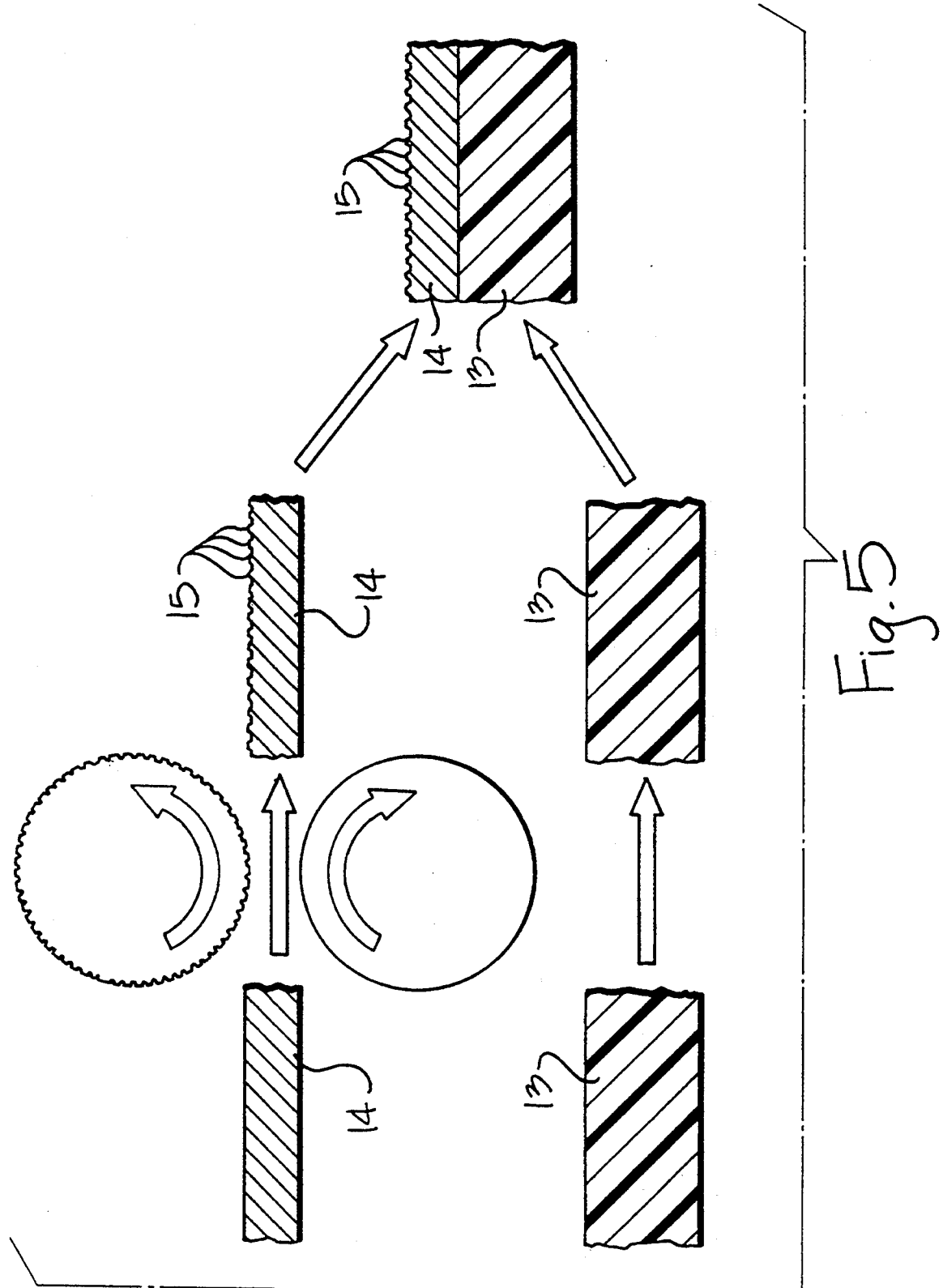
FIG. 5 is a diagram showing the forming of the asperites on the surface of the copper layer and the bonding of the roughened copper to the plastic film according to this invention.
Figure 6:
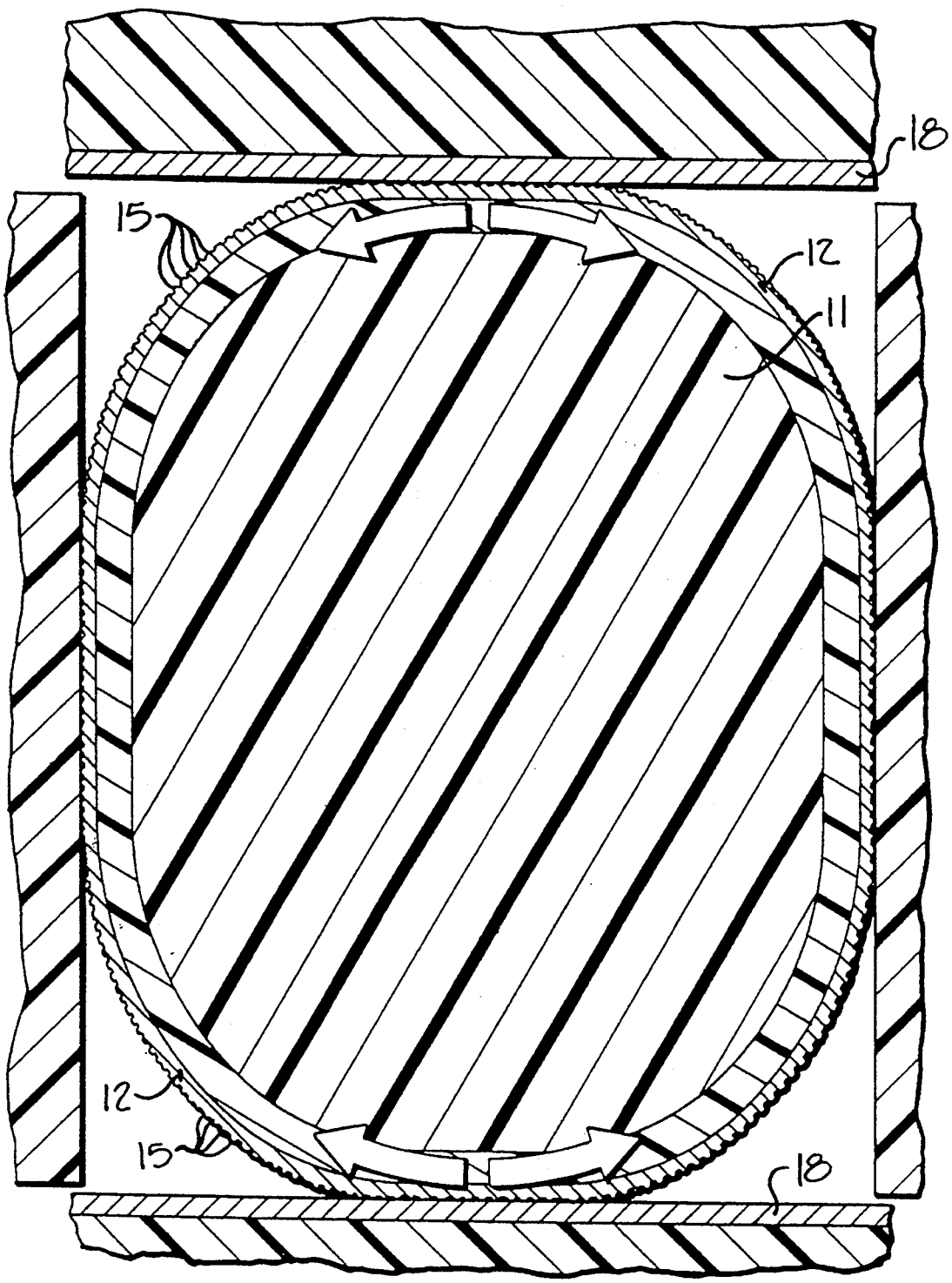
FIG. 6 is an enlarged cross-sectional view of the flexible connector of FIG. 1 showing the microwipe action of the roughened surface of the outer layer of the circuit trace across the pad of an interfacing contact.

It is desirable to roughen the surface of the copper layer 14 (and consequently the surface of the nickel layer 16 and the outer layer 17) in a defined pattern although a random disbursement of the asperites 15 can be used. It is particularly desirable to dispose the asperites 15 equidistant from one another, as best seen in FIG. 4. Each asperite 15 has a width (x) and the distance of one asperite 15 from any adjacent asperite 15 is twice the width (2×) of the asperite 15. Preferably, the asperites 15 have a cross section of approximately 100–200 microinches. However, the size may vary depending upon the type of circuit trace 12.

When the flexible connector 10 with the circuit trace 12 is disposed in a circuit interface, such as in contact with the pad of a printed circuit board, compression of the flexible connector results in a movement of the circuit trace 12 across the pad 18 of the printed circuit board in a microwiping manner. The asperites 15 on the outer roughened surface of the outer gold layer 17 abrade the surface of the pad and bite through any oxidized coating (such as tin oxide) which may be present on the surface of the pad 18. Thus, the present invention assures good electrical conductivity for the circuit interface.

The roughened surface of the outer layer 17 also effectively assures good electrical conductivity for the circuit interface when used with a surface such as a gold coated pad 18 on a printed circuit board. The microwiping action of the asperites 15 when the flexible connector is compressed or expanded is also effective in abrading the surface of the gold coated pad 18.

We claim:

1. In a circuit interface, wherein a flexible electrical connector comprises a compressible elastomeric core provided with a plurality of closely-pitched circuit traces carried thereon, wherein the circuit traces comprise a layer of copper foil having a first plating layer thereon and further having an outer gold plating layer on the said plating layer, and wherein the circuit traces engage at least one circuit element on an electrical member, the circuit element on the electrical member comprising a tin or tin alloy susceptible to oxidation, such that the oxidation on the tin or tin alloy on the circuit element interferes with good electrical conductivity with the gold-plated copper foil, the improvement comprising in combination therewith the provision of a roughened profile having uniformly spaced protrusions on the copper foil prior to application of said first plating layer and gold plating layer, whereby said plating layers are sufficiently thin so as to retain the roughened profile, thereby providing a microwiping action which bites through the oxidation formed on the tin or tin alloy to assure good electrical conductivity for the circuit interface.

2. The circuit interface of claim 1, wherein each circuit trace has an inner layer of flexible plastic film in contact with the compressible core, a layer of copper being disposed contacting the plastic film, a layer of nickel being disposed contacting the layer of copper and an outer layer of gold being disposed contacting the layer of nickel.

3. The circuit interface of claim 2, wherein the respective layers of each circuit trace has a thickness, the thicknesses being in the ratio of plastic being 50, copper being 35, nickel being 2.5 and gold being 1.

4. The circuit interface of claim 2, wherein the copper layer, the nickel layer and the gold layer each have a plurality of spaced-apart asperites formed thereon, each asperite on the copper layer corresponding with an asperite in the nickel layer and each asperite on the nickel layer corresponding with an asperite on the outer gold layer.

5. The circuit interface of claim 4, wherein the asperites on the respective layers are disposed in a defined pattern.

6. The circuit interface of claim 5, wherein each asperite has a width, and each asperite is spaced apart equidistant from the adjacent asperites by a distance which is twice the width of the asperite.

7. In a circuit interface, wherein a flexible electrical connector comprises a compressible elastomeric core provided with a plurality of closely-pitched circuit traces carried thereon, wherein the circuit traces comprise a layer of copper foil having a first plating layer thereon and further having a gold plating layer on the said first plating layer, and wherein the circuit traces engage at least one circuit element on an electrical member, the circuit element on the electrical member having a gold plating, the improvement comprising in combination therewith the provision of a roughened profile having uniformly spaced protrusions on the copper foil prior to application of said first plating layer and gold plating layer, whereby said plating layers are sufficiently thin so as to retain the roughened profile, thereby providing a microwiping action which bites into the respective gold plating layers on the circuit element and the circuit traces, whereby to assure good electrical conductivity for the circuit interface.

8. The circuit interface of claim 7, wherein each circuit trace has an inner layer of flexible plastic film in contact with the compressible core, a layer of copper being disposed contacting the plastic film, a layer of nickel being disposed contacting the layer of copper and an outer layer of gold being disposed contacting the layer of nickel.

9. The circuit interface of claim 8, wherein the respective layers of each circuit trace has a thickness, the thicknesses being in the ratio of plastic being 50, copper being 35, nickel being 2.5 and gold being 1.

10. The circuit interface of claim 8, wherein the copper layer, the nickel layer and the gold layer each has a plurality of spaced-apart asperites formed thereon, each asperite on the copper layer corresponding with an asperite on the nickel layer and each asperite on the nickel layer corresponding with an asperite on the outer gold layer.

11. The circuit interface of claim 10, wherein the asperites on the respective layers are disposed in a defined pattern.

12. The circuit interface of claim 11, wherein each asperite has a width, and each asperite is spaced apart from the adjacent asperite by a distance which is twice the width of the asperite.

* * * * *